United States Patent
Huang et al.

(10) Patent No.: US 10,642,113 B2
(45) Date of Patent: May 5, 2020

(54) DISPLAY DEVICE HAVING ANTI-STATIC FUNCTION

(71) Applicant: HON HAI PRECISION INDUSTRY CO., LTD., New Taipei (TW)

(72) Inventors: Li-Chiao Huang, New Taipei (TW); Jou-Hsuan Wu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 184 days.

(21) Appl. No.: 15/661,067

(22) Filed: Jul. 27, 2017

(65) Prior Publication Data

US 2018/0031929 A1    Feb. 1, 2018

Related U.S. Application Data

(60) Provisional application No. 62/368,184, filed on Jul. 29, 2016.

(51) Int. Cl.

| | |
|---|---|
| *G02F 1/1362* | (2006.01) |
| *H01L 51/52* | (2006.01) |
| *G02F 1/1333* | (2006.01) |
| *G02F 1/1335* | (2006.01) |
| *H01L 27/32* | (2006.01) |
| *G02F 1/1368* | (2006.01) |
| *G02F 1/13357* | (2006.01) |

(52) U.S. Cl.
CPC .. *G02F 1/136204* (2013.01); *G02F 1/133308* (2013.01); *G02F 1/133514* (2013.01); *G02F 1/133602* (2013.01); *H01L 27/322* (2013.01); *H01L 51/5237* (2013.01); *H01L 51/5253* (2013.01); *G02F 1/1368* (2013.01); *G02F 2001/133314* (2013.01); *G02F 2001/133334* (2013.01); *G02F 2001/133612* (2013.01); *G02F 2202/22* (2013.01)

(58) Field of Classification Search
None
See application file for complete search history.

(56) References Cited

U.S. PATENT DOCUMENTS

| 4,123,271 A * | 10/1978 | Fushida | G03G 5/04 |
| | | | 430/133 |
| 9,535,521 B2 | 1/2017 | Chang et al. | |
| 2005/0094053 A1* | 5/2005 | Byun | G02F 1/13452 |
| | | | 349/58 |
| 2007/0252922 A1* | 11/2007 | Oohira | G02F 1/133308 |
| | | | 349/58 |
| 2009/0073566 A1* | 3/2009 | Katsumoto | G02B 5/0226 |
| | | | 359/599 |

(Continued)

FOREIGN PATENT DOCUMENTS

| CN | 104536184 A | 4/2015 |
| TW | 201533640 A | 9/2015 |
| TW | 201619778 A | 6/2016 |

*Primary Examiner* — Edward J Glick
*Assistant Examiner* — David Y Chung
(74) *Attorney, Agent, or Firm* — ScienBiziP, P.C.

(57) ABSTRACT

A display device which is immune to a build-up of static electricity includes a display module and an anti-static layer. The anti-static layer is formed on a side surface of the display module. The anti-static layer includes an insulating layer on the side surface and a conductive layer stacked on the insulating layer. The conductive layer is electrically coupled to a conductive component of the display device.

1 Claim, 4 Drawing Sheets

(56) References Cited

U.S. PATENT DOCUMENTS

| | | | |
|---|---|---|---|
| 2009/0141209 A1* | 6/2009 | Chen | G02F 1/1336 349/58 |
| 2012/0257107 A1* | 10/2012 | Itoh | G02B 6/0085 348/553 |
| 2016/0011461 A1* | 1/2016 | Kim | G02F 1/133608 349/64 |
| 2016/0146988 A1* | 5/2016 | Kim | G02B 5/208 349/61 |

* cited by examiner

DISPLAY DEVICE HAVING ANTI-STATIC FUNCTION

FIELD

The subject matter herein generally relates to a display device having anti-static function.

BACKGROUND

A liquid crystal display device generally includes a display panel and a backlight module. When static is accumulated on the liquid crystal display device, the display device may be destroyed. Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
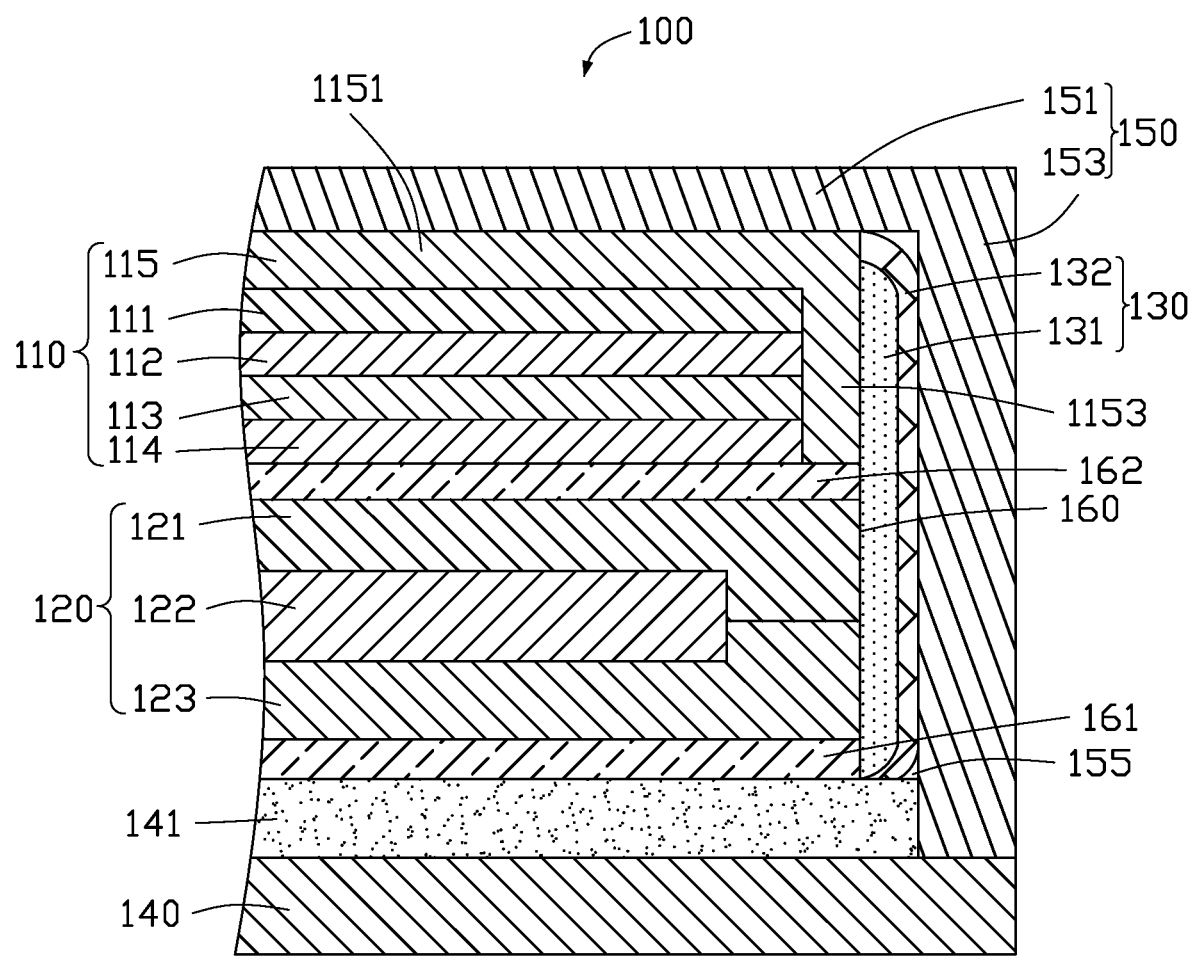
FIG. 1 is a cross-sectional view of a first exemplary embodiment of a display device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

FIG. 1 illustrates a display device 100 according to a first exemplary embodiment. The display device 100 is a liquid crystal display device and includes a backlight module 110, a display module 120, an anti-static layer 130, a cover plate 140, and an outer frame 150.

The outer frame 150 includes a bottom plate 151 and at least one side plate 153 substantially perpendicularly extending from the bottom plate 151. The bottom plate 151 and the at least one side plate 153 cooperate to form a first receiving space (not shown). The display module 120 and the backlight module 110 are positioned in the first receiving space, and the backlight module 110 is stacked on the display module 120. The backlight module 110 is adjacent to the bottom plate 151. A gap 155 is defined between the side plate 153 and the backlight module 110 together with the display module 120. The anti-static layer 130 is in the gap 155. The anti-static layer 130 is between the side plate 153 and the backlight module 110 together with the display module 120. The cover plate 140 faces the bottom plate 151 and is coupled to the at least one side plate 153 at a side of the at least one side plate 153 away from the bottom plate 151. The cover plate 140 covers the first receiving space.

The backlight module 110 provides light for image display. As shown in FIG. 1, the backlight module 110 includes a back plate 115. The back plate 115 includes a bottom wall 1151 and at least one side wall 1153 substantially perpendicularly extending from the bottom wall 1151. The bottom wall 1151 and the at least one side wall 1153 cooperate to form a second receiving space (not shown). The backlight module 110 further includes optical elements and light sources (not shown) located in the second receiving space. In the present exemplary embodiment, the optical elements include a reflective film 111, a light guide plate 112, a diffusion layer 113, and a prism sheet 114 stacked in that order. The reflective film 111 is adjacent to the bottom wall 1151. The back plate 115 is configured to support the optical laminate and light sources. The back plate 115 is made of an electrically conductive material, for example conductive metal or alloy, such as iron, stainless steel, aluminum, and aluminum alloy.

As shown in FIG. 1, the display module 120 includes a thin film transistor substrate 121, a color filter substrate 123 facing the thin film transistor substrate 121, and a liquid crystal layer 122 between the thin film transistor substrate 121 and the color filter layer 123. The thin film transistor substrate 121 is adjacent to the backlight module 110. The thin film transistor substrate 121 is a conventional thin film transistor substrate and includes a substrate (not shown) and a plurality of thin film transistors (not shown) on the substrate. The thin film transistor substrate 121 may include a plurality of conductive electrodes (not shown), such as common electrodes, pixel electrodes, and touch sensing electrodes. The color filter substrate 123 is a conventional color filter substrate comprising a substrate (not shown) and a color filter layer (not shown) on the substrate. It is understood that the display module 120 may further comprise a first polarizer 162 and a second polarizer 161. The first polarizer 162 is on a side of the thin film transistor substrate 121 away from the color filter substrate 123, and the second polarizer 161 is on a side of the color filter substrate 123 away from the thin film transistor substrate 121.

The display module 120 and the back plate 115 (particularly the at least one side wall 1153) cooperatively form at least one side surface 160 facing the at least one side plate 153 of the outer frame 150. The gap 155 is defined between the at least one side surface 160 and the at least one side plate 153.

The anti-static layer 130 includes an insulating layer 131 and a conductive layer 132. The insulating layer 131 is directly formed on the side surface 160, and the conductive layer 132 is stacked on a surface of the insulating layer 131 away from the side surface 160. Both the insulating layer 131 and the conductive layer 132 cover not only the display module 120 but also the back plate 115. Both the insulating layer 131 and the conductive layer 132 can be formed on the side surface 160 by coating. The conductive layer 132 is electrically coupled to a conductive component of the display device 100. In this exemplary embodiment, the conductive layer 132 extends to be in direct contact with the back plate 115. The insulating layer 131 has an electrical resistance value of more than $10^{10}$ ohms. For example, the insulating layer 131 may be made of polyimide. The insulating layer 131 effectively shield against static, which may lead to electrostatic charges accumulating on the insulating layer 131. When the electrostatic potential on the insulating layer 131 is increased to an extent that is beyond capability of the insulating layer 131, the insulating layer 131 may be punctured. Therefore, it is necessary for the conductive layer 132 to conduct the electrostatic charge on the insulating layer 131 to the back plate 115 and finally to outside of the display device 100. The conductive layer 132 is made of a conductive material having good conductive property, such as polymer conductive paste or a silver paste. The conductive layer 132 conducts the electrostatic charge on the insulating layer 131 to the back plate 115.

Figure 4:
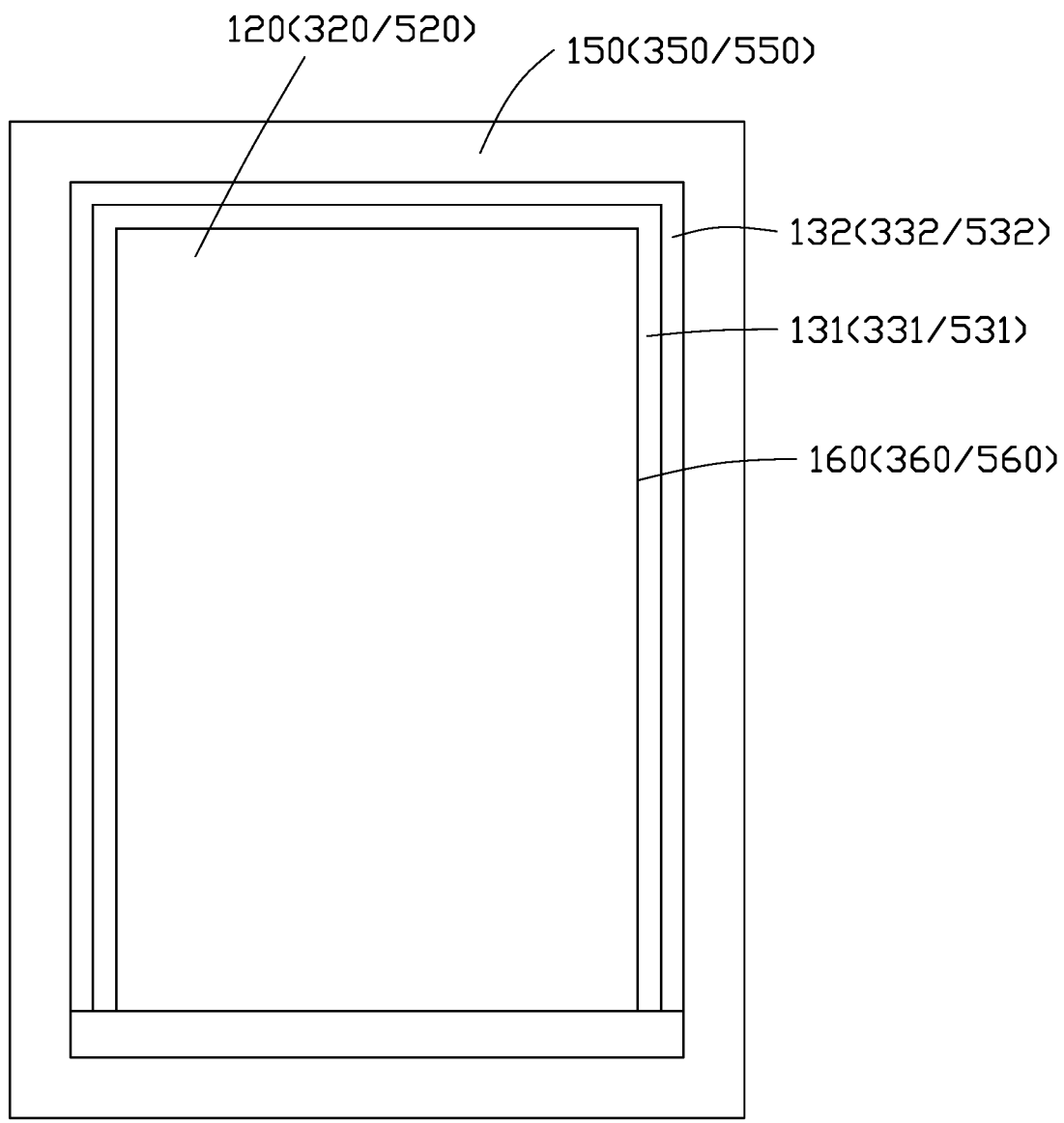
FIG. 4 is a planar view of an exemplary embodiment of a display device.

In the present exemplary embodiment, both the display module 120 and the backlight module 110 are rectangular, and the back plate 115 includes four side walls 1153. The display module 120 together with the backlight module 110 includes four side surfaces 160, as shown in FIG. 4. The anti-static layer 130 can be formed on one of the four side surfaces 160, two of the four side surfaces 160, three of the four side surfaces 160, or four of the four side surfaces 160. It is understood that the display module 120 and the backlight module 110 are not limited to being rectangular.

Figure 2:
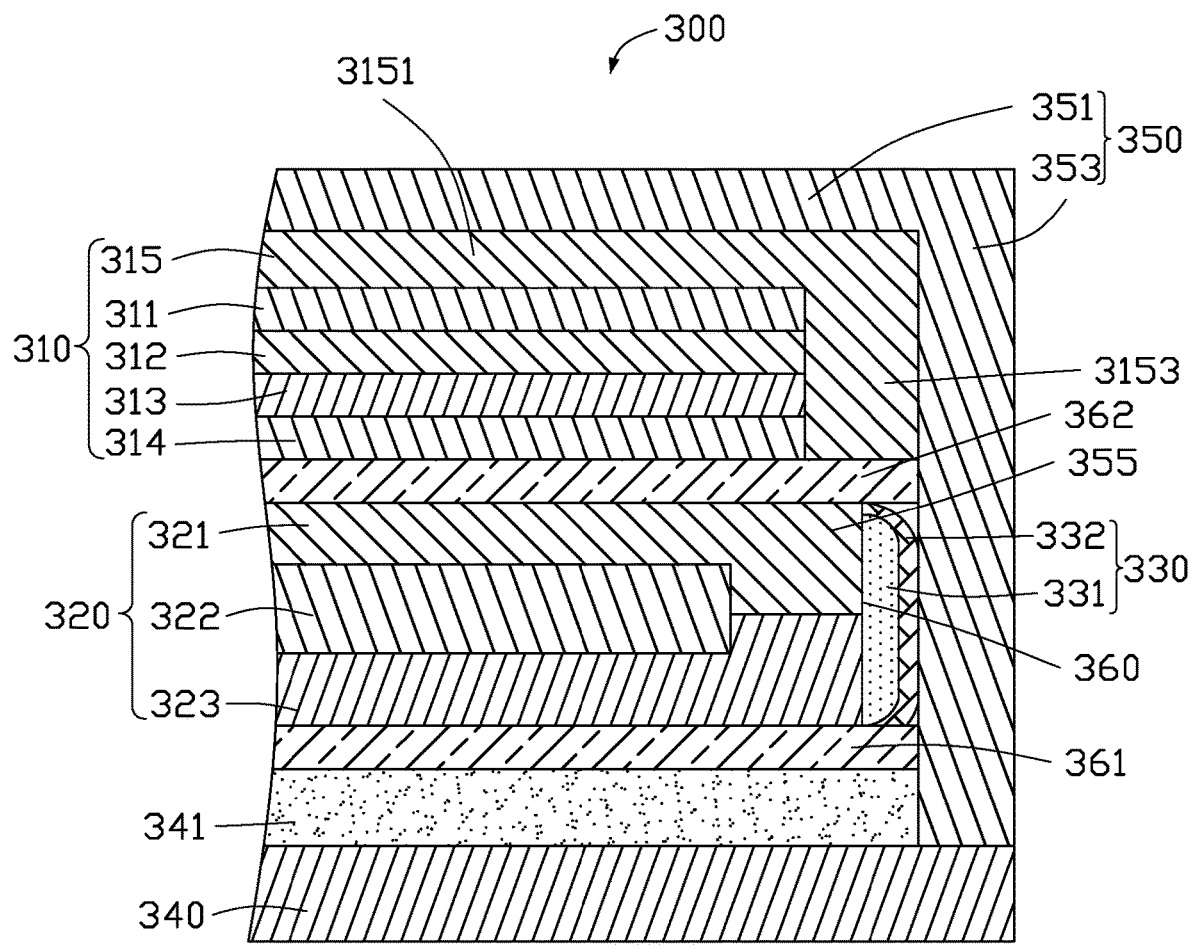
FIG. 2 is a cross-sectional view of a second exemplary embodiment of a display device.

As shown in FIG. 2, the cover plate 140 is bonded to the display module 120 by an optical clear adhesive 141.

FIG. 2 illustrates a display device 300 according to a second exemplary embodiment. The display device 300 is a liquid crystal display device and includes a backlight module 310, a display module 320, an anti-static layer 330, a cover plate 340, and an outer frame 350.

The outer frame 350 includes a bottom plate 351 and at least one side plate 353 substantially perpendicularly extending from the bottom plate 351. The bottom plate 351 and at least one side plate 353 cooperate to form a first receiving space (not shown). The display module 320 and the backlight module 310 are positioned in the first receiving space, and the backlight module 310 is stacked on the display module 320. The backlight module 310 is adjacent to the bottom plate 351. A gap 355 is defined between the side plate 353 and the display module 320. The anti-static layer 330 is in the gap 355. The anti-static layer 330 is between the side plate 353 and the display module 320. The cover plate 340 faces the bottom plate 351 and is coupled to the at least one side plate 353 at a side of the at least one side plate 353 away from the bottom plate 351. The cover plate 340 covers the first receiving space.

The backlight module 310 provides light for image display. As shown in FIG. 2, the backlight module 310 includes a back plate 315. The back plate 315 includes a bottom wall 3151 and at least one side wall 3153 substantially perpendicularly extending from the bottom wall 3151. The bottom wall 3151 and the at least one side wall 3153 cooperate to form a second receiving space (not shown). The backlight module 310 further includes optical elements and light sources (not shown) located in the second receiving space. In the present exemplary embodiment, the optical elements include a reflective film 311, a light guide plate 312, a diffusion layer 313, and a prism sheet 314 stacked in that order. The reflective film 311 is adjacent to the bottom wall 3151. The back plate 315 is configured to support the optical laminate and light sources. The back plate 315 is made of a non-conductive material, for example plastic or plastic containing fibers.

As shown in FIG. 2, the display module 320 includes a thin film transistor substrate 321, a color filter substrate 323 facing the thin film transistor substrate 321, and a liquid crystal layer 322 between the thin film transistor substrate 321 and the color filter layer 323. The thin film transistor substrate 321 is adjacent to the backlight module 110. The thin film transistor substrate 321 is a conventional thin film transistor substrate and includes a substrate (not shown) and a plurality of thin film transistors (not shown) on the substrate. The thin film transistor substrate 321 may include a plurality of conductive electrodes (not shown), such as common electrodes, pixel electrodes, and touch sensing electrodes. The color filter substrate 323 is a conventional color filter substrate comprising a substrate (not shown) and a color filter layer (not shown) on the substrate. It is understood that the display module 320 may further comprise a first polarizer 362 and a second polarizer 361. The first polarizer 362 is on a side of the thin film transistor substrate 321 away from the color filter substrate 323, and the second polarizer 361 is on a side of the color filter substrate 323 away from the thin film transistor substrate 321.

The display module 320 includes at least one side surface 360 facing the at least one side plate 353 of the outer frame 350. The gap 355 is defined between the at least one side surface 360 and the at least one side plate 353.

The anti-static layer 330 includes an insulating layer 331 and a conductive layer 332. The insulating layer 331 is directly formed on the side surface 360, and the conductive layer 332 is stacked on a surface of the insulating layer 331 away from the side surface 360. Both the insulating layer 331 and the conductive layer 332 cover the display module 320 and can be formed on the side surface 160 by coating. The conductive layer 332 extends to be in direct contact with the thin film transistor substrate 321, particularly to be electrically coupled to the conductive electrodes of the thin film transistor substrate 321. The insulating layer 331 has an electrical resistance value of more than $10^{10}$ ohms. The insulating layer 331 may effectively shield against static, which may lead to electrostatic charges accumulating on the insulating layer 331. When the electrostatic potential on the insulating layer 331 is increased to an extent that is beyond capability of the insulating layer 331, the insulating layer 331 may be punctured. Therefore, it is necessary for the conductive layer 332 to conduct the electrostatic charge on the insulating layer 331 to the thin film transistor substrate 321 and finally to outside of the display device 300. The conductive layer 332 is made of a conductive material having good conductive property, such as polymer conductive paste or a silver paste. The conductive layer 332 is configured to conduct the electrostatic charge on the insulating layer 331 to the thin film transistor substrate 321.

In the present exemplary embodiment, as shown in FIG. 4, the display module 320 is rectangular and includes four side surfaces 360. The anti-static layer 330 can be formed on one of the four side surfaces 360, two of the four side surfaces 360, three of the four side surfaces 360, or four of the four side surfaces 360. It is understood that the display module 320 is not limited to being rectangular.

As shown in FIG. 2, the cover plate 340 is bonded to the display module 320 by an optically clear adhesive 341.

Figure 3:
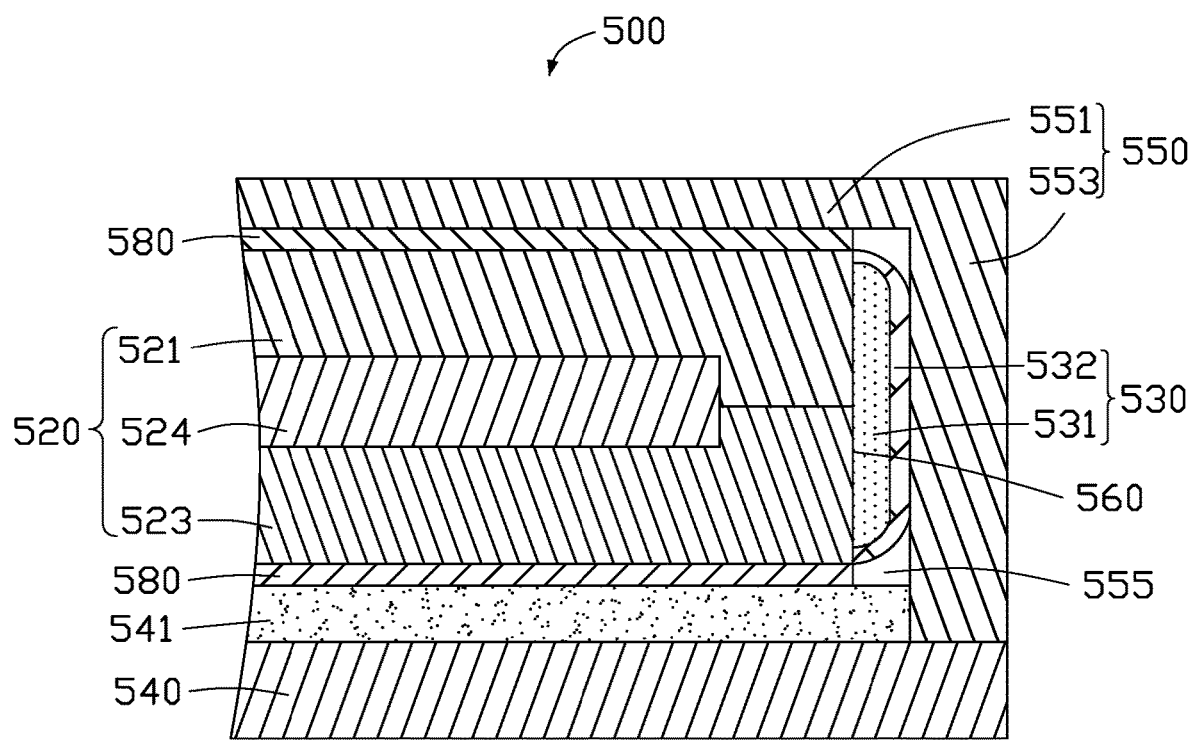
FIG. 3 is a cross-sectional view of a third exemplary embodiment of a display device.

FIG. 3 illustrates a display device 500 according to a third exemplary embodiment. The display device 500 may be an organic light-emitting diode display device or a micro-lightemitting diode display device. In the present exemplary embodiment, the display device 500 includes a display module 520, an anti-static layer 530, a cover plate 540, and an outer frame 550.

The outer frame 550 includes a bottom plate 551 and at least one side plate 553 substantially perpendicularly extending from the bottom plate 551. The bottom plate 551 and the at least one side plate 553 cooperate to form a receiving space (not shown). The display module 520 is positioned in the receiving space. A gap 555 is defined between the side plate 553 and the display module 520. The anti-static layer 530 is in the gap 555. The anti-static layer 530 is between the side plate 553 and the display module 520. The cover plate 540 faces the bottom plate 551 and is coupled to the at least one side plate 553 at a side of the at least one side plate 553 away from the bottom plate 551. The cover plate 540 covers the receiving space.

As shown in FIG. 3, the display module 520 includes a thin film transistor substrate 521, a color filter substrate 523 facing the thin film transistor substrate 521, and an organic light-emitting layer 524 between the thin film transistor substrate 521 and the color filter layer 523. The display module 520 further includes an anode layer (not shown) between the organic light-emitting layer 524 and the thin film transistor substrate 521, and a cathode layer (not shown) between the organic light-emitting layer 524 and the color filter substrate 523. The thin film transistor substrate 521 is a conventional thin film transistor substrate and includes a substrate (not shown) and a plurality of thin film transistors (not shown) on the substrate. The thin film transistor substrate 521 may include a plurality of conductive electrodes (not shown), such as common electrodes, pixel electrodes, and touch sensing electrodes. The color filter substrate 523 is a conventional color filter substrate comprising a substrate (not shown) and a color filter layer (not shown) on the substrate.

The display module 520 includes at least one side surface 560 facing the at least one side plate 553 of the outer frame 550. The gap 555 is defined between the at least one side surface 560 and the at least one side plate 553.

The anti-static layer 530 includes an insulating layer 531 and a conductive layer 532. The insulating layer 531 is directly formed on the side surface 560, and the conductive layer 532 is stacked on a surface of the insulating layer 531 away from the side surface 560. Both of the insulating layer 531 and the conductive layer 532 cover the display module 520 and can be formed on the side surface 560 by coating. The conductive layer 532 extends to be in direct contact with the thin film transistor substrate 521, particularly to be electrically coupled to the conductive electrodes of the thin film transistor substrate 521. The insulating layer 531 has an electrical resistance value of more than $10^{10}$ ohms. The insulating layer 531 may effectively shield against static, which may lead to electrostatic charges accumulating on the insulating layer 531. When the electrostatic potential on the insulating layer 531 is increased to an extent that is beyond capability of the insulating layer 531, the insulating layer 531 may be punctured. Therefore, it is necessary for the conductive layer 532 to conduct the electrostatic charge on the insulating layer 531 to the thin film transistor substrate 521 and finally to outside of the display device 500. The conductive layer 532 is made of a conductive material having good conductive property, such as polymer conductive paste or a silver paste. The conductive layer 532 is configured to conduct the electrostatic charge on the insulating layer 531 to the thin film transistor substrate 521.

In the present exemplary embodiment, as shown in FIG. 4, the display module 520 is rectangular and includes four side surfaces 560. The anti-static layer 530 can be formed on one of the four side surfaces 560, two of the four side surfaces 560, three of the four side surfaces 560, or four of the four side surfaces 560. It is understood that the display module 320 is not limited to being rectangular.

As shown in FIG. 3, the cover plate 540 is bonded to the display module 520 by an optically clear adhesive 541.

The insulating layers 131, 331, 531 may be made of an UV acrylic glue, such as poly(methyl methacrylate). The conductive layers 132, 332, 532 may be made of conductive polymer, such as poly-dimethyl siloxane containing conductive carbon black or poly(3,4-ethylenedioxythiophene) doped with poly(styrene sulfonate) (PEDOT/PSS).

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A display device comprising:
   a backlight module;
   a display module stacked on the backlight module, the display module and the backlight module cooperatively defining at least one side surface; and
   an anti-static layer on the at least one side surface;
   an outer frame receiving the display module and the backlight module;
   wherein the anti-static layer comprises an insulating layer on the at least one side surface and a conductive layer stacked on the insulating layer; the conductive layer is electrically coupled to a conductive component of the display device;
   wherein the insulating layer is configured to accumulate electrostatic charges, and the anti-static layer is configured to conduct the electrostatic charges from the insulating layer to the conductive component;
   wherein the backlight module comprises a back plate made of an electrically conductive material; the conductive layer extends to be electrically coupled to the back plate;
   wherein the back plate comprises a bottom wall and at least one side wall substantially perpendicularly extending from the bottom wall; the display module and the at least one side wall are coupled to define the at least one side surface;
   wherein a gap is formed between the back plate and the outer frame; the anti-static layer is in the gap; the insulating layer is in direct contact with the at least one side surface, and the conductive layer is in direct contact with a surface of the insulating layer away from the at least one side surface.

* * * * *